United States Patent

Geho et al.

[11] Patent Number: 5,985,472
[45] Date of Patent: Nov. 16, 1999

[54] MAGNETOSTATIC WAVE DEVICE

[75] Inventors: Mikio Geho, Kusatsu; Masaru Fujino, Otsu; Takashi Fujii, Otsu; Hiroshi Takagi, Otsu, all of Japan

[73] Assignee: Murata Manufacturing Co., Ltd., Japan

[21] Appl. No.: 08/876,555

[22] Filed: Jun. 16, 1997

[51] Int. Cl.$^6$ ........................................................ G11B 5/66
[52] U.S. Cl. .................... 428/692; 428/694 GT; 428/694 ST; 428/900; 385/1; 385/6; 385/130; 359/280; 359/282; 333/134; 333/147; 333/148; 333/150; 333/156; 333/193; 333/201; 252/62.51; 252/62.56; 252/62.57
[58] Field of Search ............................ 428/692, 694 GT, 428/694 ST, 900; 252/62.51, 62.56, 62.57; 333/134, 147, 148, 150, 156, 193, 201; 359/280, 282; 385/1, 6, 130

[56] References Cited

U.S. PATENT DOCUMENTS 5,601,935  2/1997  Fujino et al. ............................ 428/692

Primary Examiner—Leszek Kiliman
Attorney, Agent, or Firm—Ostrolenk, Faber, Gerb & Soffen, LLP

[57] ABSTRACT

There is provided a magnetostatic wave device which operates even with a substitution R, A:YIG having a small film thickness and which has a wider operational frequency band. A magnetostatic wave device comprising a magnetic garnet film is provided which is made of a material expressed by a general formula: $(Y_{1-r} R_r)_3 (Fe_{1-a} A_a)_5 O_{12}$ where R is at least one selected from among La, Bi, Gd and Lu; A is at least one selected from among Al, Ga, In and Sc; r and a are within the ranges $0 \leq r \leq 1$ and $0 \leq a < 1$, respectively; and r and a can not be zero at the same time. Further, the crystal structure of said magnetic garnet film is a superlattice.

9 Claims, 5 Drawing Sheets

MAGNETOSTATIC WAVE DEVICE

BACKGROUND OF THE INVENTION

1. Field of the Invention

The present invention relates to magnetostatic wave devices and, more particularly, to a magnetostatic wave device comprising a magnetic garnet film, the material of said magnetic garnet film being represented by a general formula:

$$(Y_{1-r} R_r)_3(Fe_{1-a} A_a)_5 O_{12}$$

where R is at least one material selected from among La, Bi, Gd and Lu; A is at least one material selected from among Al, Ga, In and Sc; r and a are within the ranges $0 \leq r \leq 1$ and $0 \leq a < 1$, respectively; and r and a are not be zero at the same time.

2. Description of the Related Art

The trend toward intense exchange of information has resulted in increasing needs for microwave devices for processing signals in microwave bands recently. Referring especially to devices for analog processing, development is active on signal processing devices such as resonators, filters and S/N enhancers. As materials used for such magnetostatic wave devices, magnetic garnet materials represented by YIGs are primarily used.

A YIG is formed as a film on a single crystal substrate made of gadolinium gallium garnet (GGG), samarium gallium garnet (SGG), neodymium gallium garnet (NGG) or the like primarily using a liquid phase epitaxial process (LPE process) and in a configuration integral with the substrate.

FIG. 1 shows a noise filter, which is one example of magnetostatic wave device. The noise filter includes a GGG substrate 1 and a garnet single crystalline film 2 provided on the GGG substrate 1. The noise filter further includes a pair of electrodes 3 provided on the garnet single crystalline film 2. In FIG. 1, the reference symbol H denotes the direction of the applied external magnetic field, Iin denotes the direction of entering the microwave, W denotes the direction of propagation of magnetostatic surface wave (MSSW), and Iout denotes the direction of the generation of the microwave.

For the purposes of adjusting the magnetic characteristics of such a YIG and matching the lattice constant thereof with that of the substrate, it is actively attempted to design materials with various elements substituted for the C-site (the position of Y) and the A, D-site (the position of Fe) of a YIG. The terms "C-site" and "A, D-site" are representations used to represent a magnetic garnet material using a general formula: $C_3(A, D)_5 O_{12}$. Such substitution R, A:YIGs (substitution yttrium-iron-garnets) are becoming dominant materials for magnetostatic wave devices.

A single crystal is considered preferable when it has no variation in composition as a whole and is uniform from a crystallographical point of view. Highest possible uniformity has been pursued also in the development of substitution R, A:YIGs manufactured using LPE processes.

However, a problem has existed in that the half-value width ($\Delta H$) of ferromagnetic resonance, which is an important magnetic property for a substitution R, A:YIG used for a magnetostatic wave device, can not be preferable when the thickness of the film is small, and specifically, when the film thickness is 6 $\mu$m or less. In addition, conventional magnetostatic wave devices have not been successful yet in satisfying the demand for devices having an operational frequency band as wide as possible, which is a characteristic required for various reasons including compensation for temperature characteristics.

It is therefore a primary object of the present invention to provide a magnetostatic wave device which operates even with a substitution R, A:YIG having a small film thickness and which has a wider operational frequency band.

SUMMARY OF THE INVENTION

The present invention provides a magnetostatic wave device of the above mentioned kind, which is characterized in that the crystal structure of said magnetic garnet film is a superlattice.

In the above magnetostatic wave device, said superlattice may be determined by X-ray diffractometry.

In the above magnetostatic wave device, a series of satellite reflections may exist in said magnetic garnet film when a rocking curve is measured thereon using X-ray diffractometry, and the garnet film reflection may be the zero-order reflection of said satellite reflections.

The statement "a series of satellite reflections exist in the magnetic garnet film when a rocking curve is measured thereon using X-ray diffractometry, and a principal lattice point of said magnetic garnet film is the zero-order reflection" means that the crystal structure varies periodically and that there is a repeated structure that is an integral multiple of a unit cell which can be determined using the rocking curve method or the X-ray small angle scattering method in the field of X-ray diffractometry.

In general, when it is assumed that a regular repeated structure (a "superlattice") exists in a single crystal and that L represents the cycle of the repeated structure in such a case, lattice points whose unit is 1/L appear near the origin and such lattice points are observed using the X-ray small angle scattering method. Further, a group of lattice points whose unit is 1/L simultaneously appear around each of the lattice points as in small angle regions. Measurement of a rocking curve of reflections of an index (hkl) in the repeating direction allows L to be obtained from Equation 1 shown below where m and n represent the orders of the satellite reflections.

$$L = (m-n)\lambda / \{2(\sin \theta m - \sin \theta n)\} \qquad \text{Equation 1}$$

$\lambda$ represents the wavelength of the X-ray, and $\theta m$ and $\theta n$ represent Bragg angles associated with the m-th order and the n-th order satellite reflections, respectively.

While possible methods for achieving this repeated structure (superlattice) include, for example, a method wherein the rotation of the substrate is periodically reversed in an LPE process and a method wherein the growing position is periodically changed, any method may be employed as long as it allows introduction of periodical changes in structure. The composition of a substitution R, A:YIG may vary with the structural changes or may be a uniform composition having no variation. Further, since the film is normally grown perpendicularly to the film, this repeated structure exists in a direction perpendicular to the film. In practice, the cycle may be any value as long as it is an integral multiple of the unit cell.

As dopants for a substitutional R, A:YIG single crystalline film, according to the known techniques (for example, Japanese patent publication No. H2-97495), La, Bi, Gd and Lu are appropriate for R in the chemical formula $(Y_{1-r} R_r)_3(Fe_{1-a} A_a)_5 O_{12}$ and Al, Ga, In and Sc are appropriate for A in the same considering the sizes of the radii, solid-solubility to the YIG film, and valency of the ions. According to the present invention, no limit is put on the amount of substitution for a substitution R, A:YIG to control saturation magnetization and the lattice constant in a wide range.

Magnetostatic wave devices according to the present invention are devices utilizing magnetostatic waves, e.g., MSSW (magnetostatic surface waves), MSFVW (magnetostatic forward volumetric waves) and MSBVW (magnetostatic backward volumetric waves)).

According to the present invention, a substitution R, A:YIG film which is a magnetic garnet film that constitutes a part of a magnetostatic wave device of the invention has a structure which periodically varies in a direction perpendicular to the film. This film brings a wider operational frequency band to the magnetostatic wave device. Further, since a magnetic garnet film made of this substitution R, A:YIG exhibits good ferromagnetic resonance characteristics even if it is thin, the range of application of a magnetostatic wave device can be expanded.

According to the present invention, a magnetostatic wave device can be obtained which operates even with a substitution R, A:YIG having a small film thickness, e.g., 5 $\mu$m but exhibiting good ferromagnetic resonance characteristics in spite of the small film thickness and which has a wider range of application.

The above and other objects, features and advantages of the present invention will become more apparent from the following detailed description of preferred embodiments of the present invention.

DETAILED DESCRIPTION OF THE INVENTION

A first embodiment of the present invention will now be described.

Figure 2:
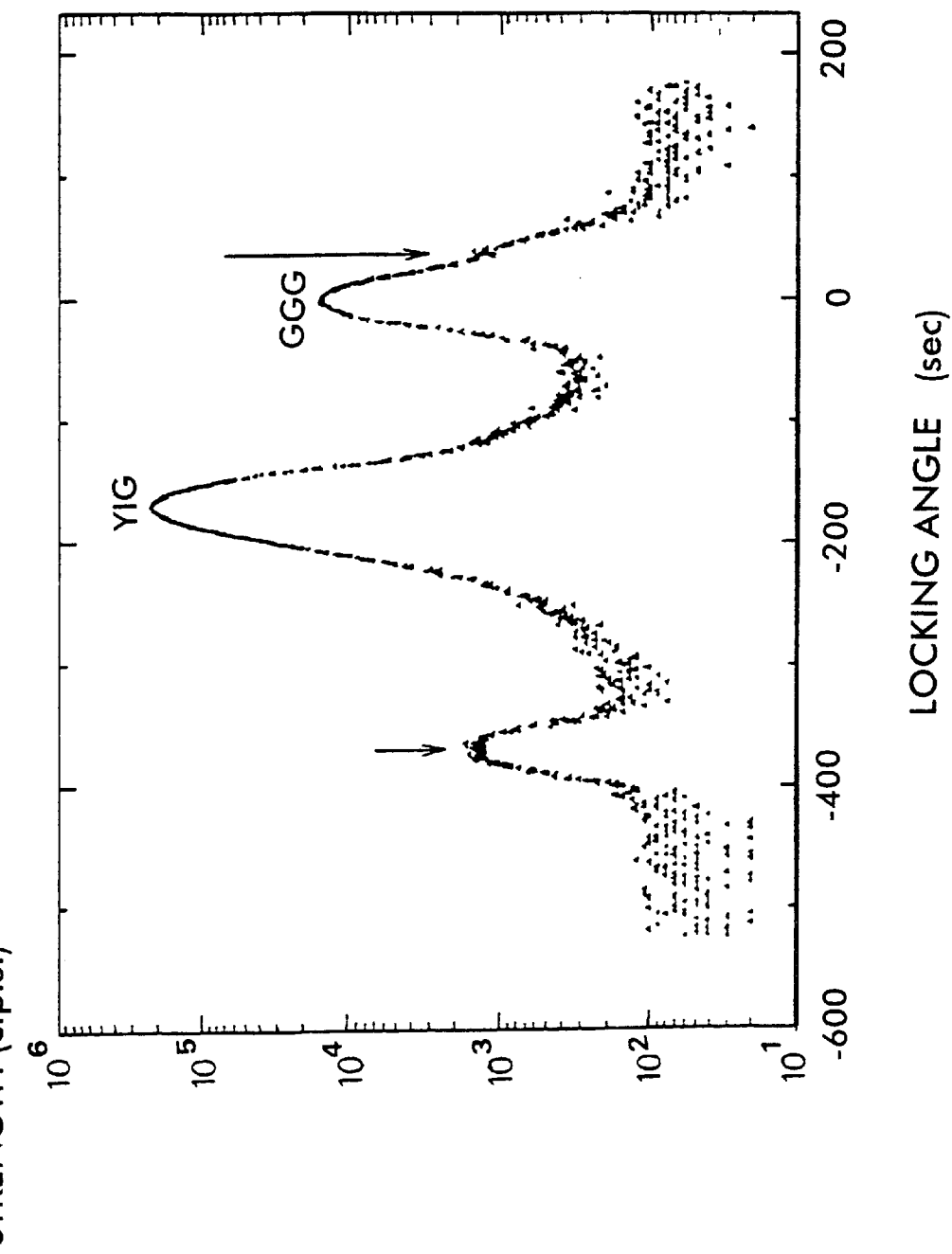
FIG. 2 is a graph showing a rocking curve in the vicinity of an (888) reflection of a magnetic garnet film used in a magnetostatic wave device according to the present invention.

A La, Ga:YIG ($Y_{2.93}La_{0.07}Fe_{4.60}Ga_{0.40}O_{12}$) film was grown to a thickness of 5 $\mu$m on a (111) GGG substrate by means of an LPE process using a PbO—$B_2O_3$ type melt. In doing so, the rotation of the substrate in the melt was reversed every 15 seconds to introduce periodic structural changes in the YIG film. Hereinafter, the substitutional La, Ga:YIG film is referred to as "REV1". An X-ray rocking curve of REV1 was measured with respect to an (888) reflection. FIG. 2 is a graph showing the rocking curve in the vicinity of the (888) reflection of REV1. In FIG. 2, the reflection indicated by "YIG" represents a reflection from REV1, and the reflection indicated by "GGG" represents a reflection from GGG which is the substrate. The reflections indicated by the arrows in FIG. 2 are satellite reflections from a laminar structure whose crystal structure varies periodically. As apparent from FIG. 2, satellite reflections appeared in REV1, which proved the presence of a periodic structure.

Figure 3:
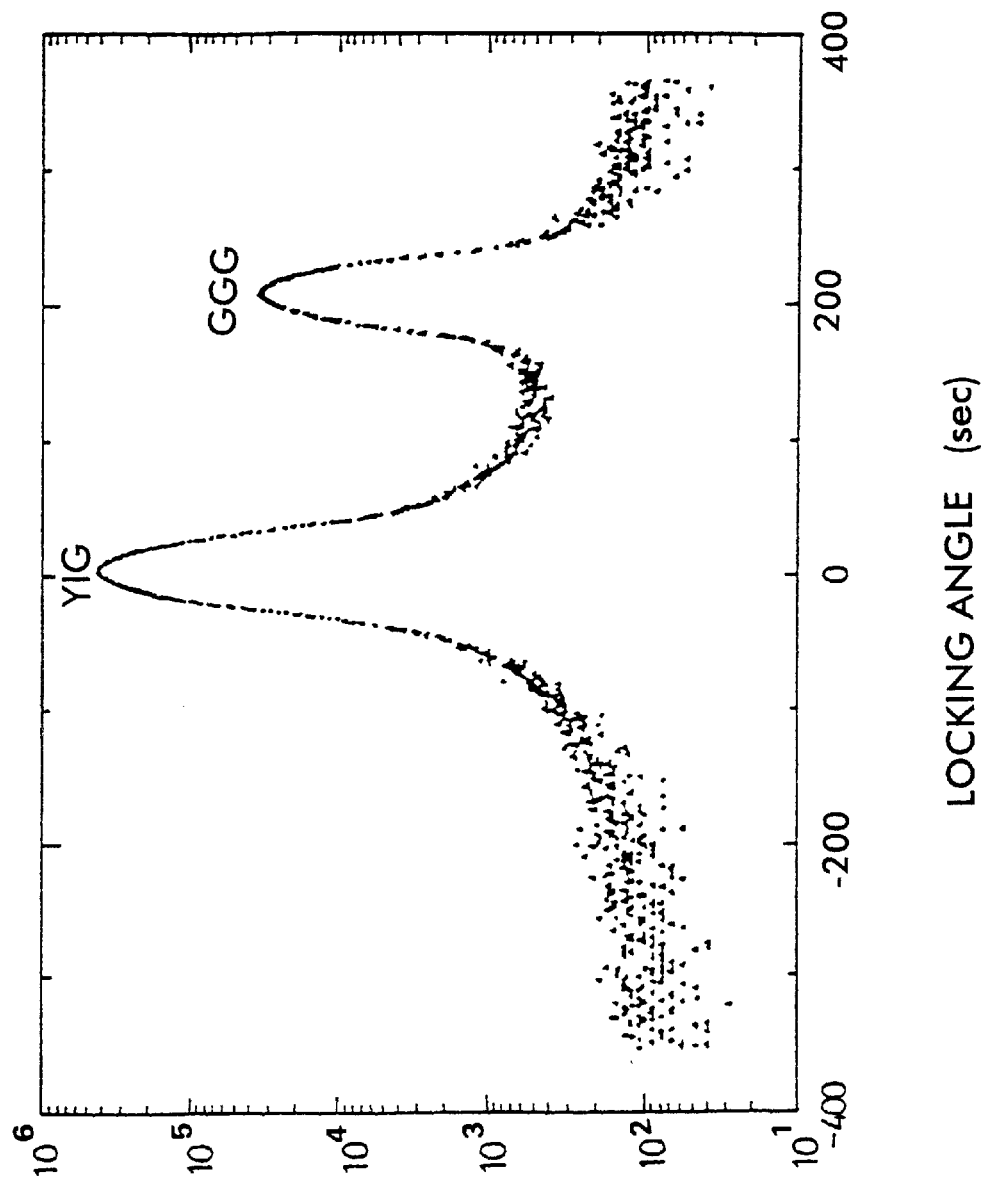
FIG. 3 is a graph showing a rocking curve in the vicinity of an (888) reflection of a magnetic garnet film used in a magnetostatic wave device as an example for comparison.

Further, a La, Ga:YIG film was grown to a thickness of 5 mm using an LPE process as an example for comparison under conditions which were all the same as those for REV1 except that substrate was rotated in the melt only in one direction without reversal. Hereinafter, this substitution La, Ga:YIG film is referred to as "ROT1". An X-ray rocking curve of ROT1 was measured with respect to an (888) reflection as done on REV1. FIG. 3 is a graph showing the rocking curve in the vicinity of the (888) reflection of ROT1. In FIG. 3, the reflection indicated by "YIG" represents a reflection from ROT1, and the reflection indicated by "GGG" represents a reflection from GGG which is the substrate. As apparent from FIG. 3, no satellite reflection appeared in ROT1.

Thereafter, measurement of ferromagnetic resonance (FMR) was carried out on each of REV1 and ROT1, and an external magnetic field was applied thereto in a direction perpendicular to the YIGs to measure the half-value width ($\Delta H$) of ferromagnetic resonance. As a result, while REV1 provided a preferable result of 0.86 Oe, ROT1 did not exhibit a Lorenz type resonance spectrum like that of REV1 and did not have a measurable $\Delta H$. Normally, a magnetostatic wave device must have a $\Delta H$ value of 1.0 Oe or less to be usable.

Figure 1:
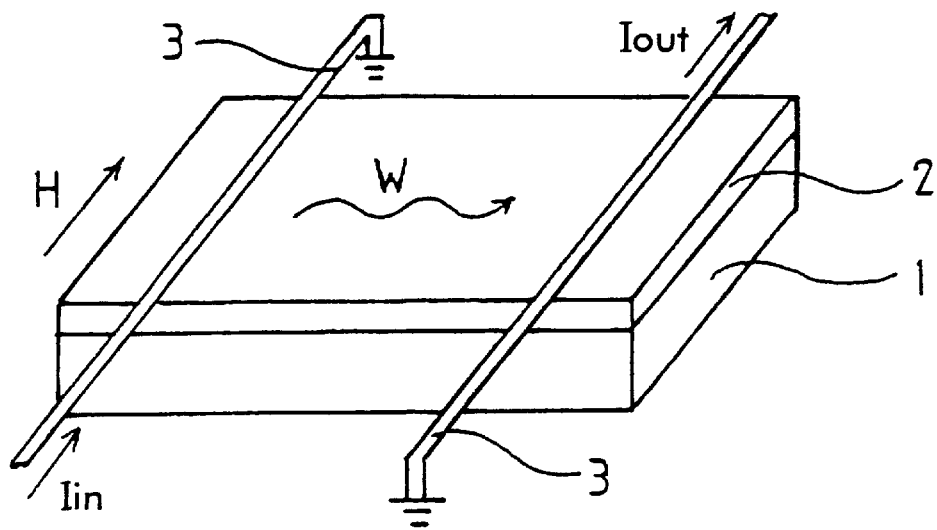
FIG. 1 is a perspective view of a magnetostatic wave device (noise filter).
Figure 4:
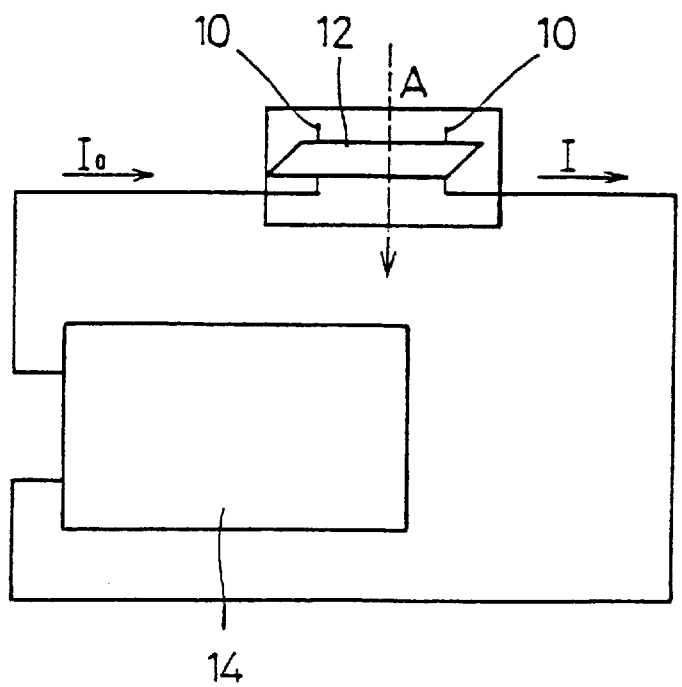
FIG. 4 is a plan view showing a measurement system for measuring filter characteristics.

Next, each of REV1 and ROT1 was subjected to a cutting process and a process of removing the YIG film on one side thereof and subjected to measurement of MSSW filter characteristics which are basic characteristics of a magnetostatic wave device using the measurement system shown in FIG. 4. A strip line 10 was formed on an epoxy substrate, and a sample for measurement 12 having REV1 and ROT1 thereon was placed on the strip line 10. Frequency characteristics of those films as filters were measured by a network analyzer 14 with an external magnetic field of 60 G in parallel with the epoxy substrate applied in the direction of the arrow A shown in FIG. 4. As a result, ROT1, the example for comparison, exhibited no filter characteristics at all, and REV1 according to the present invention exhibited good filter characteristics.

A second embodiment of the present invention will now be described.

La, Ga:YIG ($Y_{2.93}La_{0.07}Fe_{4.60}Ga_{0.40}O_{12}$) films were grown to a thickness of 20 $\mu$m using the same melt, conditions and method as those in the first embodiment except that growing time was prolonged. A substitution La, Ga:YIG film into which periodic structural changes were introduced by reversing the rotation of the substrate during the above process is hereinafter referred to as "REV2". On the other hand, a substitution La, Ga:YIG film as an example for comparison grown by rotating the substrate only in one direction without reversal is referred to as "ROT2". X-ray rocking curves of REV2 and ROT2 were measured with respect to (888)reflections thereof as done in the first embodiment. As a result, while satellite reflections appeared in REV2 to prove the presence of a periodic structure, no satellite reflection appeared in ROT2.

Thereafter, measurement of ferromagnetic resonance (FMR) was carried out on each of REV2 and ROT2, and the half-value width ($\Delta H$) of ferromagnetic resonance was measured as done in the first embodiment. As a result, REV2 and ROT2 respectively provided values of 0.92 Oe and 0.88 Oe which were both less than 1.0 Oe. As to saturation magnetization ($2\pi Ms$), REV2 and ROT2 provided similar values of 1150 G and 1160 G, respectively.

Figure 5:
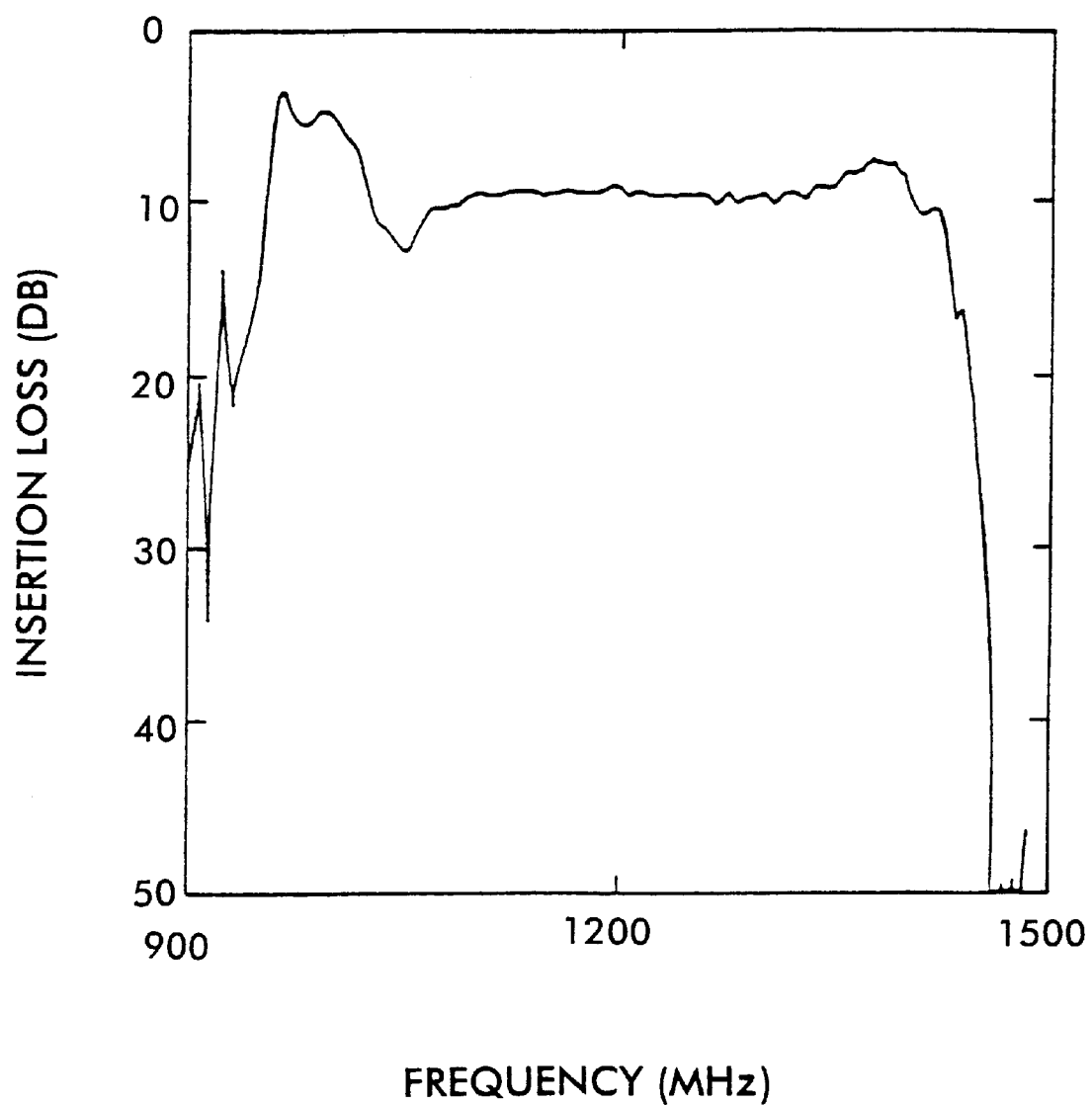
FIG. 5 is a graph showing frequency characteristics of a magnetostatic wave device according to the present invention.
Figure 6:
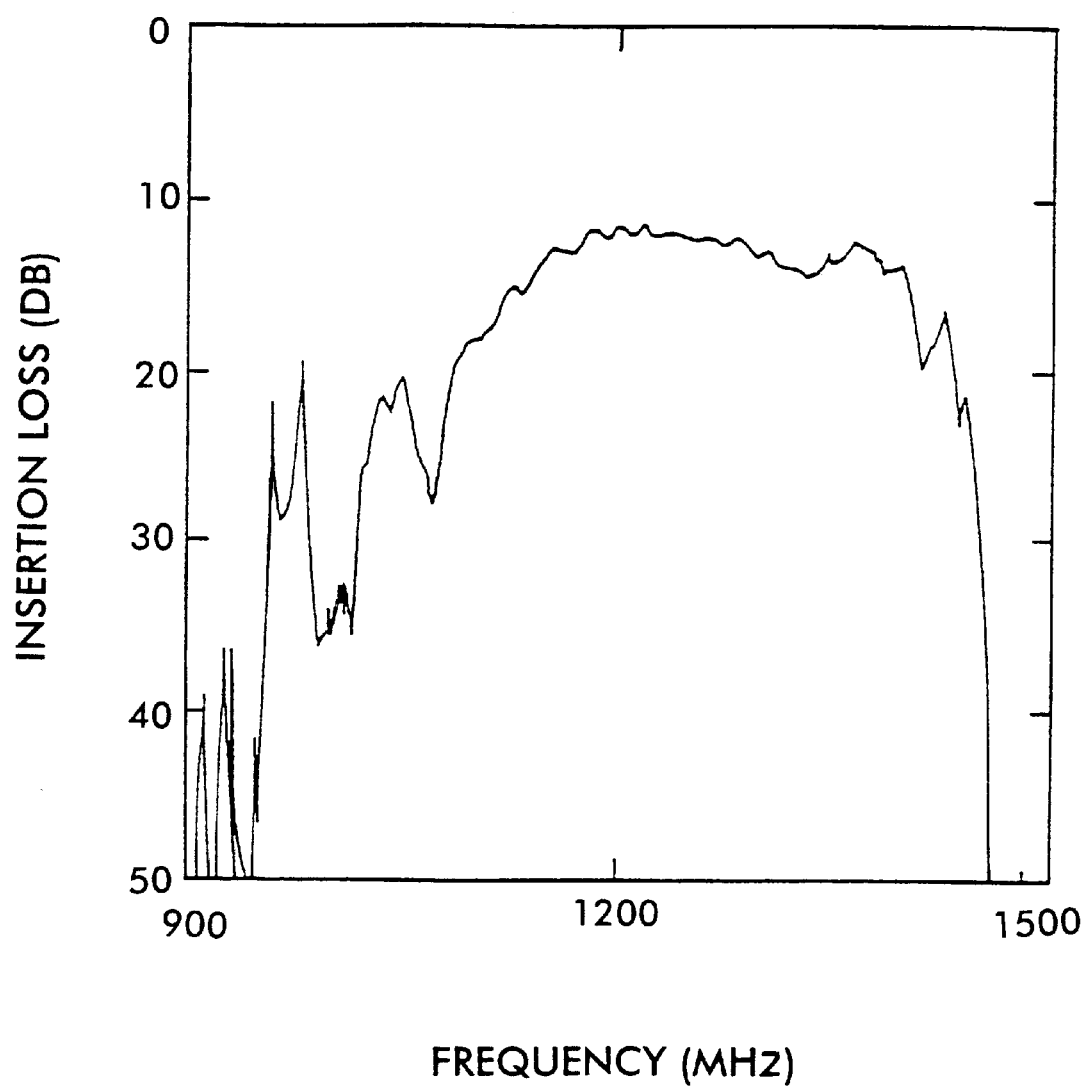
FIG. 6 is a graph showing frequency characteristics of a magnetostatic wave device as an example for comparison.

Next, each of REV2 and ROT2 was subjected to measurement of MSSW filter characteristics using the measurement system shown in FIG. 4 as done in the first embodiment to measure the frequency characteristics of those films as filters. FIG. 5 is a graph showing the result of the frequency characteristics measurement on REV2, and FIG. 6 is a graph showing the result of the frequency characteristics measurement on ROT2. While the ROT2 comparison example exhibited a rise having a gentle gradient and had a flat effective frequency region of about 150 MHz as shown in FIG. 6, REV2 according to the present invention exhibited a steep rise and had an increased effective frequency region of about 300 MHz which is about twice that of ROT2 as shown in FIG. 5. Further, REV2 was better than ROT2 in flatness.

What is claimed is:

1. A magnetostatic wave device comprising a substitution R, A:YIG film having a crystal structure which varies periodically in a direction perpendicular to the film by a period which is an integral multiple of a unit cell of the crystal structure.

2. A magnetostatic wave device according to claim 1 in which the substitution R, A:YIG film is represented by the formula:

$$(Y_{1-r} R_r)_3(Fe_{1-a} A_a)_5 O_{12}$$

where R is at least one member selected from among La, Bi, Gd and Lu; A is at least one member selected from among Al, Ga, In and Sc; r and a are within the ranges $0 \leq r \leq 1$ and $0 \leq a < 1$, respectively; and r and a are not be zero at the same time.

3. A magnetostatic wave device according to claim 2, characterized in that said periodic variation is determined by X-ray diffractometry.

4. A magnetostatic wave device according to claim 3, characterized in that a series of satellite reflections exist in said magnetic garnet film when a rocking curve is measured thereon using X-ray diffractometry, and wherein the garnet film reflection can be the zero-order reflection of said satellite reflections.

5. A magnetostatic wave device according to claim 2, wherein R is La and A is Ga.

6. A substitution R, A:YIG film having a crystal structure which varies periodically in a direction perpendicular to the film by a period which is an integral multiple of a unit cell of the crystal structure.

7. A substitution R, A:YIG film according to claim 6 in which the substitution R, A:YIG is represented by the formula:

$$(Y_{1-r} R_r)_3(Fe_{1-a} A_a)_5 O_{12}$$

where R is at least one member selected from among La, Bi, Gd and Lu; A is at least one member selected from among Al, Ga, In and Sc; r and a are within the ranges $0 \leq r \leq 1$ and $0 \leq a < 1$, respectively; and r and a are not be zero at the same time.

8. A magnetostatic wave film according to claim 7, wherein R is La and A is Ga.

9. A magnetostatic wave device comprising a magnetic garnet film represented by the formula:

$$(Y_{1-r} R_r)_3(Fe_{1-a} A_a)_5 O_{12}$$

where R is at least one member selected from among La, Bi, Gd and Lu; A is at least one member selected from among Al, Ga, In and Sc; r and a are within the ranges $0 \leq r \leq 1$ and $0 \leq a < 1$, respectively; and r and a are not be zero at the same time, wherein there are at least two satellite reflections with respect to a main lattice representing a zero-order reflection in a rocking curve chart measured on the magnetic garnet film using X-ray diffractometry.

* * * * *